United States Patent [19]

Nakaya et al.

[11] Patent Number: 5,264,714
[45] Date of Patent: Nov. 23, 1993

[54] THIN-FILM ELECTROLUMINESCENCE DEVICE

[75] Inventors: Hiroaki Nakaya; Takuo Yamashita, both of Tenri; Takashi Ogura, Nara; Masaru Yoshida, Ikoma, all of Japan

[73] Assignee: Sharp Kabushiki Kaisha, Osaka, Japan

[21] Appl. No.: 769,752

[22] Filed: Oct. 3, 1991

Related U.S. Application Data

[63] Continuation of Ser. No. 540,337, Jun. 19, 1990, abandoned.

[30] Foreign Application Priority Data

Jun. 23, 1989 [JP] Japan .................................. 1-162138
Jul. 5, 1989 [JP] Japan .................................. 1-173631

[51] Int. Cl.$^5$ .............................................. H01L 33/00
[52] U.S. Cl. ........................................ 257/78; 257/79; 257/98; 257/631; 257/637; 257/646
[58] Field of Search .......................... 357/2, 4, 6, 8; 313/509; 257/78, 79, 98, 631, 637, 639, 646

[56] References Cited

U.S. PATENT DOCUMENTS

| 4,672,266 | 6/1987 | Taniguchi et al. | 357/6 |
| 4,808,880 | 2/1989 | Thioulouse | 313/507 |
| 4,877,995 | 10/1989 | Thioulouse et al. | 313/385 |
| 4,880,661 | 11/1989 | Endo et al. | |
| 4,893,154 | 1/1990 | Hirai et al. | 357/4 |
| 4,957,772 | 9/1990 | Saitoh et al. | 437/5 |

FOREIGN PATENT DOCUMENTS

| 57-100173 | 6/1982 | Japan . |
| 59-195237 | 9/1984 | Japan . |
| 60-28105 | 2/1985 | Japan . |
| 1-188891 | 8/1986 | Japan . |

OTHER PUBLICATIONS

Hirao et al., "Thermal Stability of Hydrogen in Silicon Nitride Films Prepared by ECR Plasma CVD method," *Japanese Journal of Applied Physics*, vol. 27, No. 4, Apr., 1988, pp. 528-533.

Dharmadhikari, "Characterization of Plasma-Deposited Silicon Nitride Coating Used For Integrated Circuit Encapsulation", *Thin Solid Films*, 153 (1987) pp. 459-468.

Nguyen, "Effect of Si-H and N-H Bonds on Electrical Properties of Plasma Deposited Silicon Nitride and Oxynitride Films", *Journal of Electronic Materials*, vol. 16, No. 4, 1987, pp. 275-281.

Primary Examiner—Andrew J. James
Assistant Examiner—Courtney A. Bowers

[57] ABSTRACT

A thin-film electroluminescence device has transparent electrodes formed on a transparent substrate, a lower dielectric layer formed on the substrate having the transparent electrodes, a luminescent layer formed on the lower dielectric layer, an upper dielectric layer formed on the luminescent layer, and back electrodes formed on the upper dielectric layer. At least one of the upper and lower dielectric layers includes a SiN:H film formed in contact with the luminescent layer by a plasma chemical vapor deposition method. The SiN:H film contains N—H bonds of $1.2 \times 10^{22}/cm^3$ or less to control an amount of change in emission-start voltage to 30 V or less.

9 Claims, 7 Drawing Sheets

THIN-FILM ELECTROLUMINESCENCE DEVICE

This application is a continuation of application Ser. No. 07/540,337 filed Jun. 19, 1990 now abandoned.

FIELD OF THE INVENTION

The present invention relates to a thin-film electroluminescence (EL) device which has upper and lower dielectric layers and a luminescent layer sandwiched between the upper and lower dielectric layers and more particularly to a thin-film EL device wherein the upper and/or lower dielectric layers include a SiN:H film formed by a plasma chemical vapor deposition (CVD) method.

BACKGROUND OF THE INVENTION

FIG. 1 shows a cross-sectional view of a conventional thin-film EL device. The conventional device has a glass substrate 11, transparent electrodes 12 in stripes formed on the glass substrate 11, a lower dielectric layer consisting of a silicon oxide ($SiO_2$) film 13 and a SiN film 14, formed on the glass substrate 11 having the transparent electrodes 12, a luminescent layer 15 formed on the lower dielectric layer by an electronic beam deposition method, an upper dielectric layer consisting of a silicon nitride ($Si_3N_4$) film 16 and an aluminum oxide ($Al_2O_3$) film 17, formed on the luminescent layer 15, and Al back electrodes 18 in stripes formed on the upper dielectric layer in such a manner as to intersect the transparent electrodes 12. The upper and lower dielectric layers are formed by a sputtering method. Voltage is applied between the transparent electrodes 12 and the back electrodes 18 so as to make the luminescent layer 15 emit light and to derive the light toward the glass substrate 11.

Generally, use of the sputtering method for forming films lowers mass productivity because:
(i) Film formation speed is slow.
(ii) A film formation area depends on a size of a target, and therefore is limited.

Therefore, the conventional thin-film E1 device whose dielectric layers are formed by a sputtering technique cannot offer a good productivity.

Recently, in order to solve the problem, an attempt has been made to form upper and lower dielectric layers by a plasma CVD method offering a good productivity. In this attempt, it has been tried to form a $Si_3N_4$ film, which has a great influence on EL characteristics, by using $SiH_4$ as material gas, specifically as reaction gas.

If a $Si_3N_4$ film is formed on a luminescent layer by a plasma CVD method, however, an emission-start voltage Vth changes by aging, resulting in a low reliability. The change in the emission-start voltage Vth depends on a film quality of the $Si_3N_4$ (referred to as SiN:H hereinbelow) film.

Moreover, the conventional thin-film EL device shown in FIG. 1 has the following problem.

Because the upper dielectric layer 16 is transparent and the back electrodes 18 are of Al, light emitted from the luminescent layer 15 toward the back electrodes 18 is reflected by the back electrodes 18. Reflected light passes the luminescent layer 15 onto the glass substrate 11. Accordingly, the conventional thin-film EL device does not offer display of good contrast.

In order to solve this problem, application of a brown amorphous silicon (a-Si) film into the upper dielectric layer 16 has been tried. However, if such an a-Si film is formed at a back-electrode-side surface of the upper dielectric layer 16 without any special consideration, dielectric breakdown mode of the device is apt to be of a propagate type, and luminance versus applied voltage (referred to as luminance-voltage hereafter) characteristics are not acceptable or practicable.

SUMMARY OF THE INVENTION

Accordingly, it is an object of the present invention to provide a thin-film EL device which not only offers good productivity through the use of a plasma CVD method in forming a SiN:H film but also restrains change in emission-start voltage Vth.

It is another object of the present invention to provide a thin-film EL device which offers display of good contrast, good dielectric breakdown characteristics, and good luminance-voltage characteristics of a practicable level.

According to one embodiment of the present invention, in a thin-film EL device having upper and lower dielectric layers and a luminescent layer sandwiched between the upper and lower dielectric layers, at least one of the upper and lower dielectric layers includes a SiN:H film formed in contact with the luminescent layer by a plasma chemical vapor deposition method and the SiN:H film contains N—H bonds of $1.2 \times 10^{22}/cm^3$ or less.

This invention has been made based on the finding by the inventors that the number of N—H bonds per unit volume in a SiN:H film formed by a plasma CVD method is closely related to an mount of change $\Delta Vth$ in emission-start voltage caused by the aging.

FIG. 5 shows an experiment result indicating that there is a strong positive correlation between the number of N—H bonds per unit volume in a SiN:H film formed by a plasma CVD method and an amount of change $\Delta Vth$ in emission-start voltage. Experiments were done by the inventors by changing a film fabrication condition such as a substrate temperature, input power, reaction gas pressure, etc.

From the correlation, it can be said that by controlling the number of N—H bonds per unit volume to $1.2 \times 10^{22}/cm^3$ at the most, the amount $\Delta Vth$ can be limited to less than about 30 V being a practicable level in most cases. From the correlation, it can be also said that, preferably, by controlling the number of N—H bonds per unit volume to $0.7 \times 10^{22}/cm^3$ at the most, the amount of change in emission-start voltage can be controlled to less than 15 V in most cases.

The device of the present invention offers an improved mass productivity because a plasma CVD method is adopted in stead of a sputtering method.

According to another embodiment of the invention, in a thin-film electroluminescence device having transparent electrodes formed on a transparent substrate, a lower dielectric layer formed on the substrate having the transparent electrodes, a luminescent layer formed on the lower dielectric layer, an upper dielectric layer formed on the luminescent layer, and back electrodes formed on the upper dielectric layer, the upper dielectric layer includes an amorphous silicon (a-Si) film and first and second dielectric films sandwiching the amorphous silicon therebetween, the first dielectric film being formed in contact with the luminescent layer.

With this construction, because the amorphous silicon film of the upper dielectric layer is a brown film, light emitted from the luminescent layer toward the back electrodes is absorbed in the amorphous silicon film, and not reflected by the back electrodes onto the transparent or glass substrate, unlike a conventional upper dielectric layer consisting of transparent films only. As a result, good contrast is obtained.

Moreover, the amorphous silicon film is sandwiched by the dielectric films, which are preferably a silicon oxynitride ($Si_3N_4$) film and a silicon oxynitride (SiON) film, the upper dielectric layer is prevented from having a PROPAGATE-type dielectric breakdown mode. As a result, the thin-film EL device of the present invention can have acceptable dielectric breakdown characteristics.

If the dielectric films of the upper dielectric layer are a $Si_3N_4$ film and a SiON film, the upper dielectric layer can be easily formed by a plasma CVD method.

In addition, because the amorphous silicon film has photoconductivity, as soon as the luminescent layer starts emitting light, even a small amount of light or even very weak light, an effective field intensity for the luminescent layer increases, and as a result, a luminance-voltage characteristics curve can have an abrupt rising. FIG. 9 shows such a curve. This indicates that the EL characteristics have been improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
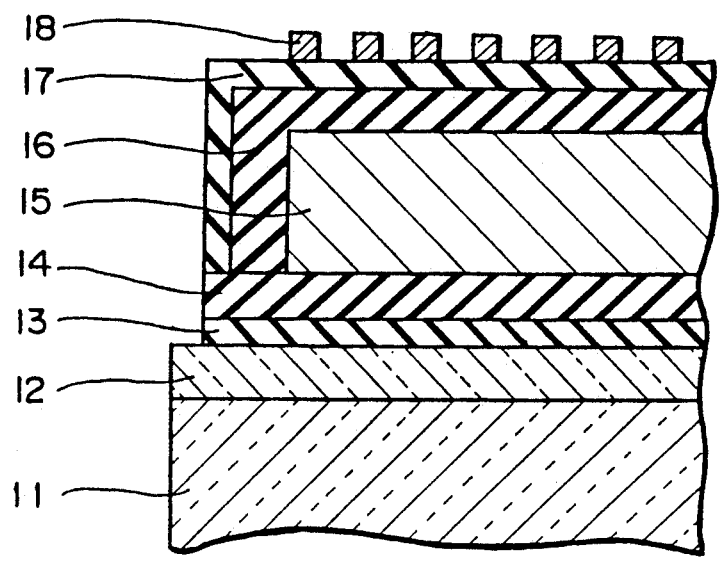
FIG. 1 is a cross sectional view showing a conventional thin-film EL device.
Figure 2:
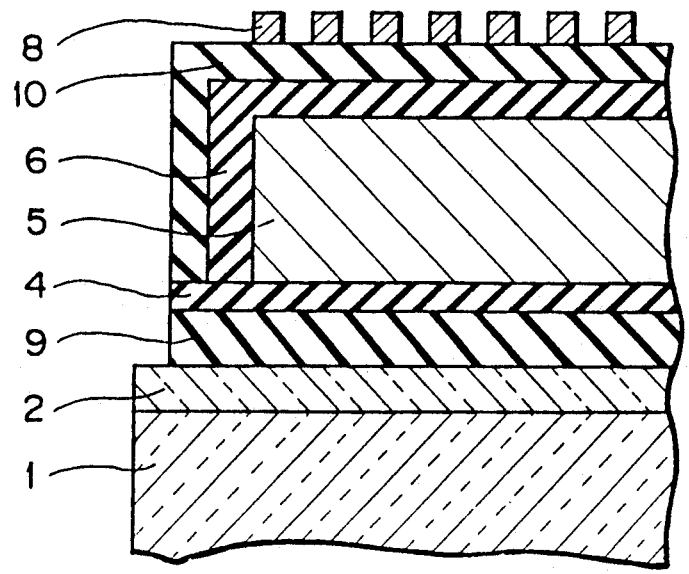
FIG. 2 is a cross sectional view showing a thin-film EL device according to a first embodiment of the present invention.

Referring now to FIG. 2, which shows a thin-film EL device according to a first embodiment of the present invention, the device has transparent electrodes 2 in stripes on a glass substrate 1, a dielectric film 9, a SiN:H film 4 formed by a plasma CVD method, a luminescent layer 5, another SiN:H film 6 formed by a plasma CVD method, another dielectric film 10, and Al back electrodes 8 in stripes intersecting the transparent electrodes 2 at right angles. The dielectric film 9 and the Sin:H film 4 constitute a lower dielectric layer, and the SiN:H film 6 and the dielectric film 10 constitute an upper dielectric layer. The dielectric films 9 and 10 are respectively formed by a mass productive method such as a sol-gel method.

Figure 5:
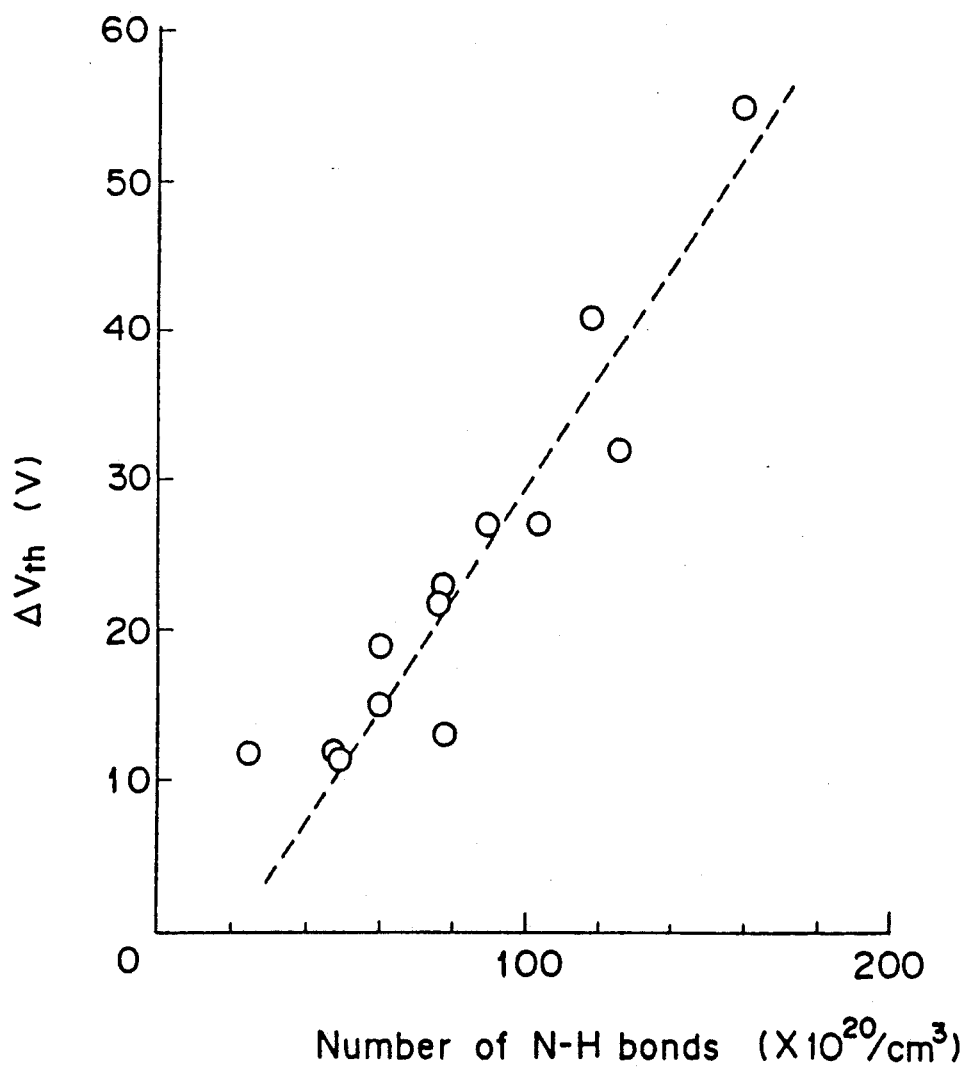
FIG. 5 is a graph showing a correlation between the number of N—H bonds and an amount of change in emission-start voltage.
Figure 6:
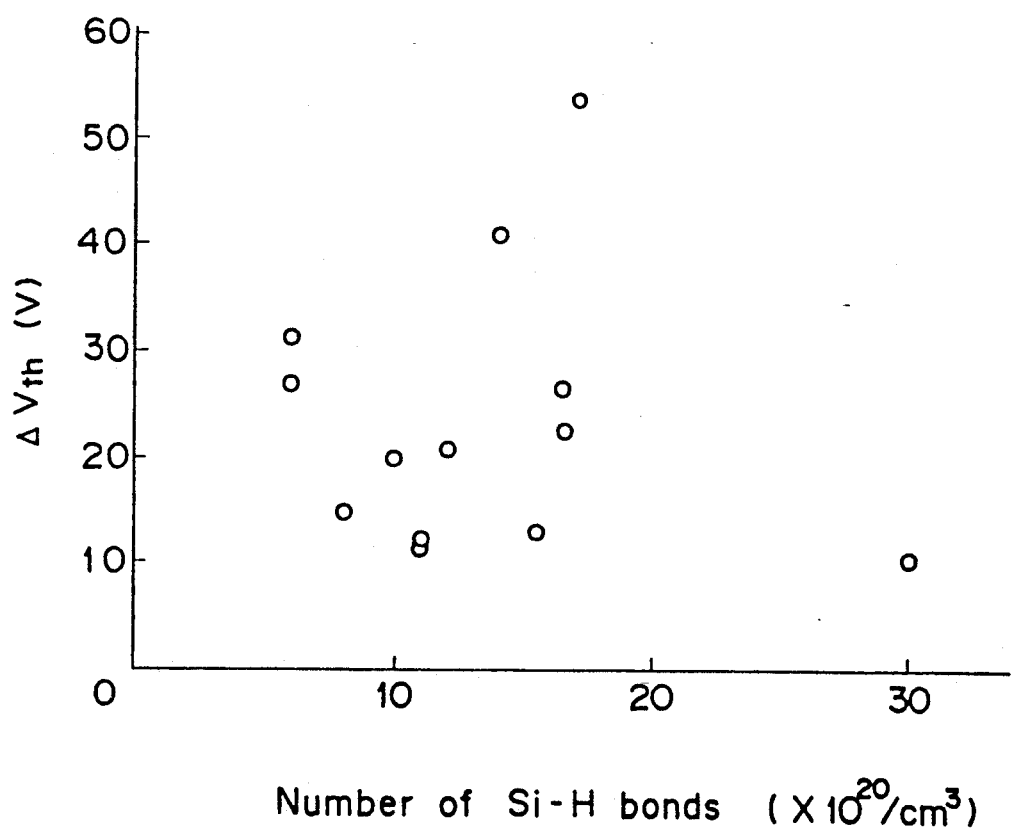
FIG. 6 is a graph showing a relation between the number of Si-H bonds and an amount of change in emission-start voltage.

As aforementioned and shown in FIG. 5, it has been proved that there is a correlation between the number of N—H bonds per unit volume in a SiN:H film and an amount $\Delta$Vth of change in emission-start voltage due to aging. There exists no relation between the number of Si—H bonds and the value $\Delta$Vth, as obvious from FIG. 6.

FIG. 5 proves that the amount $\Delta$Vth of change in emission-start voltage can be controlled to about 30 V or less in most cases by controlling the N—H bond content in the SiN:H films 4 and 6 to $1.2 \times 10^{22}/cm^3$ or less. It is preferable to control the N—H bond content to less than $0.7 \times 10^{22}/cm^3$. By doing so, the amount $\Delta$Vth can be controlled to less than 15 V.

Figure 3:
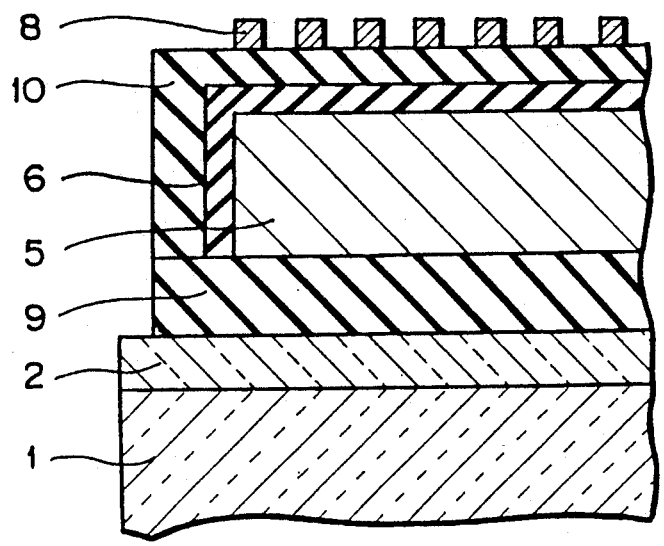
FIG. 3 is a cross sectional view showing a modification of the thin-film EL device of FIG. 2.
Figure 4:
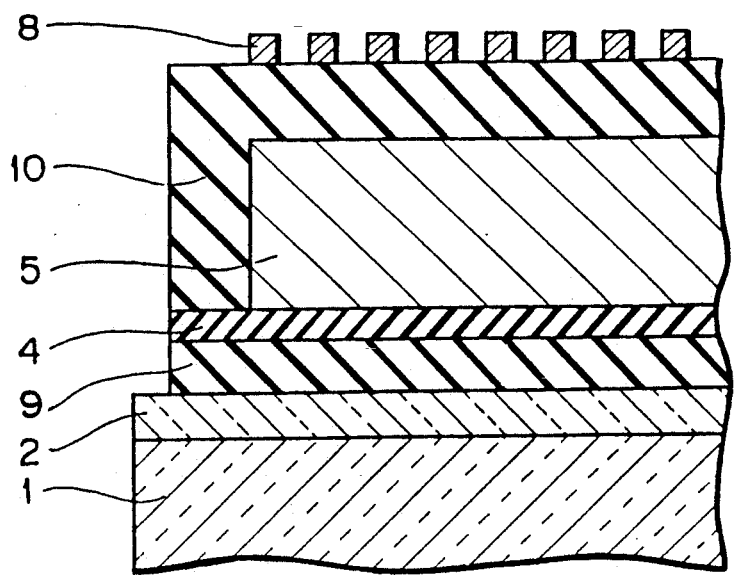
FIG. 4 is a cross sectional view showing another modification of the thin-film EL device of FIG. 2.

The thin-film EL device of FIG. 2 has such a SiN:H film in both the upper and lower dielectric layers. However, a SiN:H film having such a limited N—H bonds content may be included only in one of the upper and lower dielectric layers, as shown in FIGS. 3 and 4.

Figure 7:
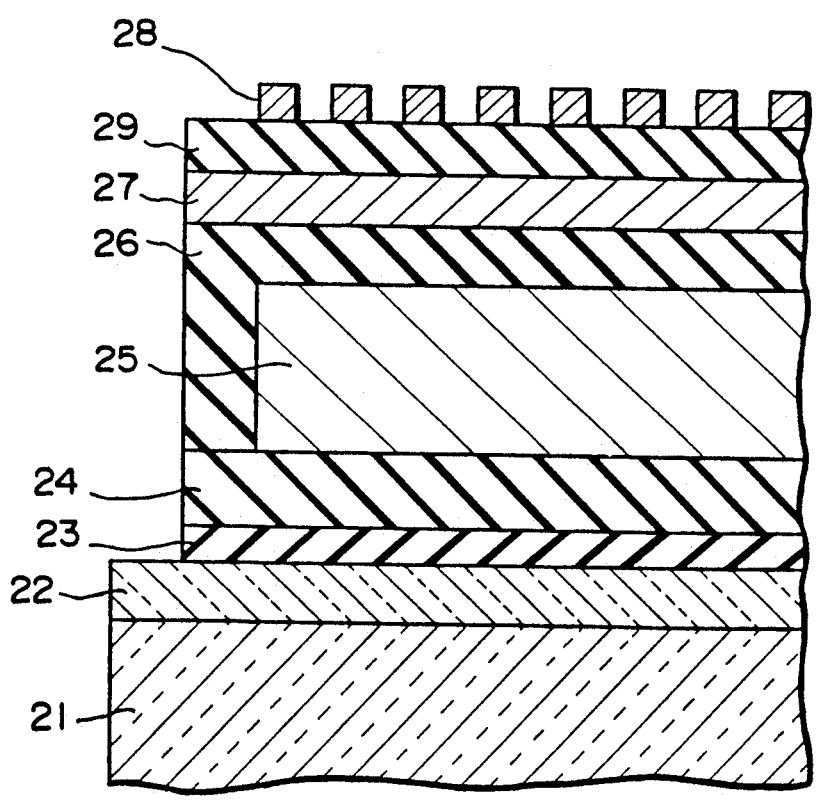
FIG. 7 is a cross-sectional view showing a thin-film EL device according to a second embodiment of the present invention.
Figure 8:
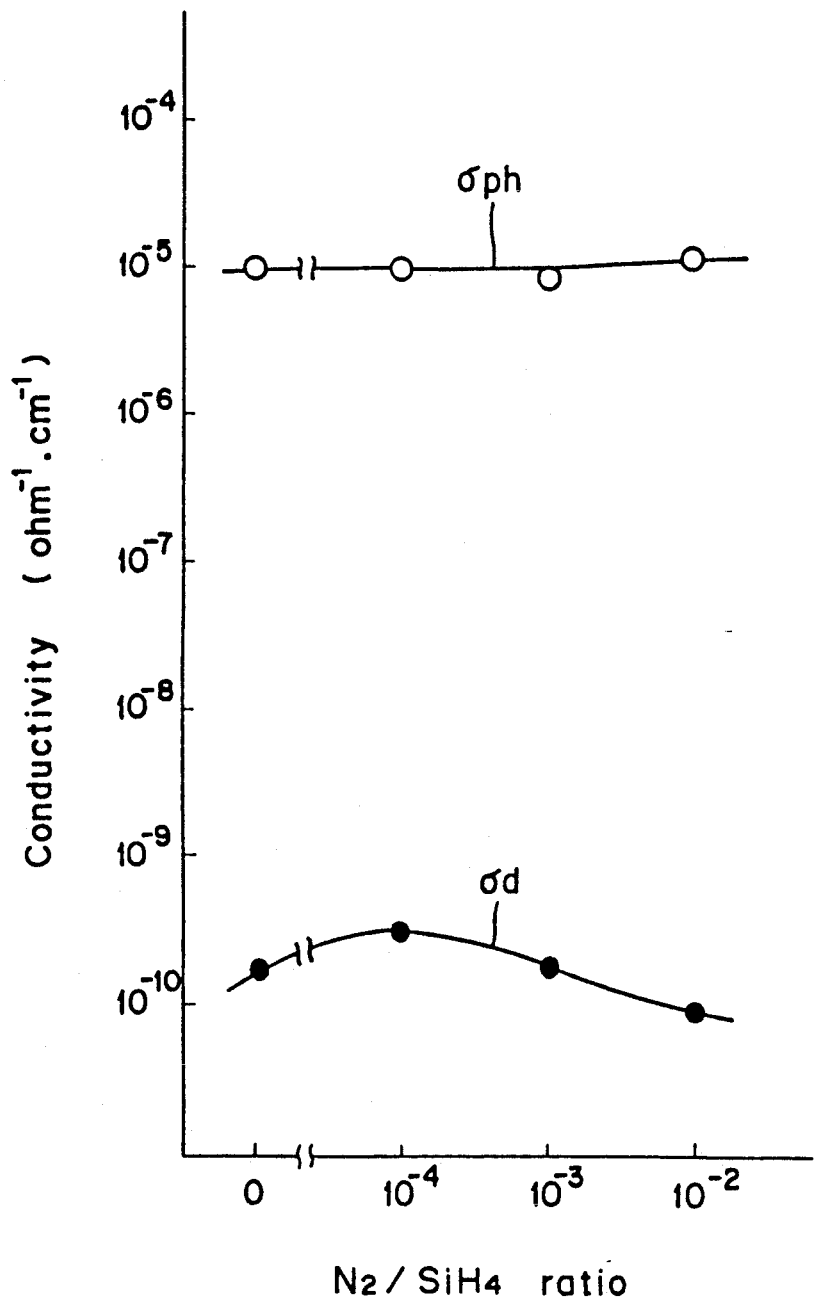
FIG. 8 is a graph showing a conductivity of an amorphous silicon film.
Figure 9:
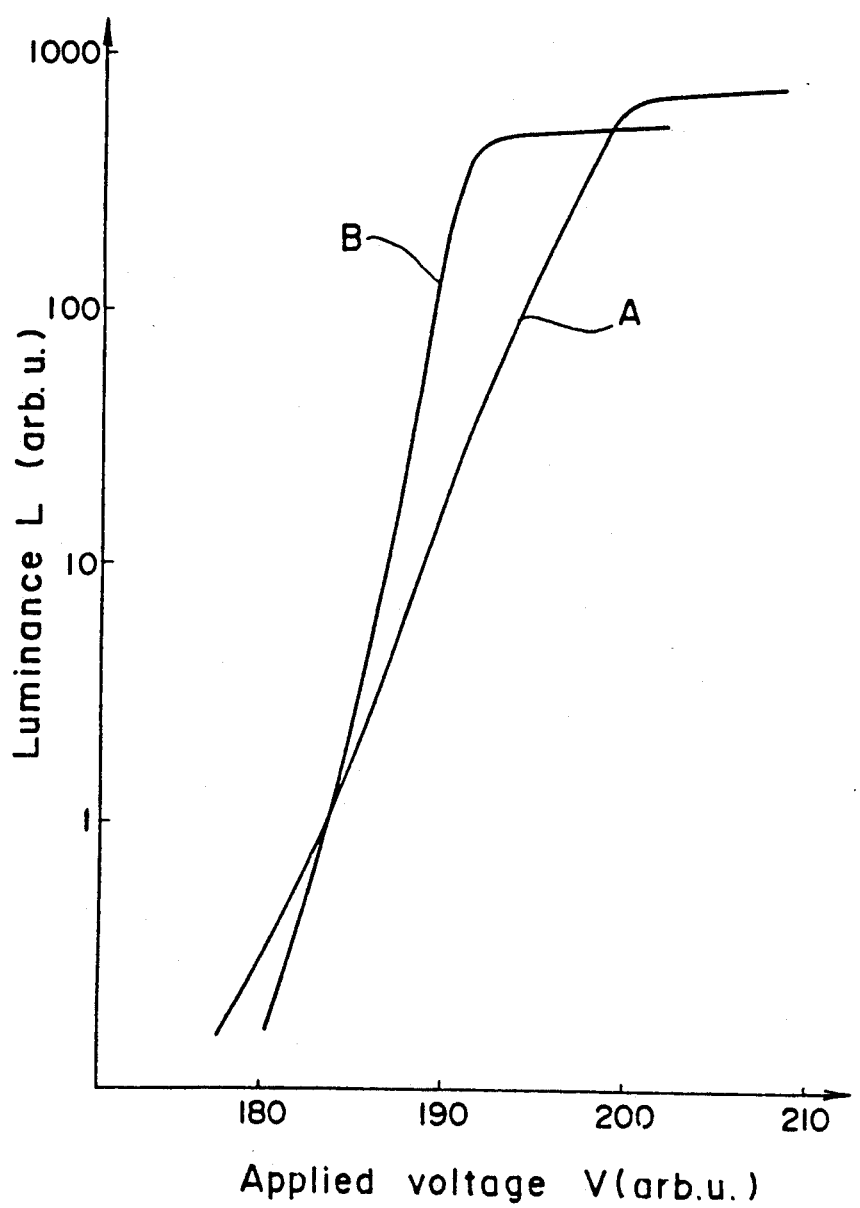
FIG. 9 is a graph showing luminance-voltage characteristics, in which a curve B is of the present invention and a curve A is of a prior art device.

In what follows, a second embodiment of the present invention is described in accordance with FIGS. 7-9.

Referring now to FIG. 7 showing a cross sectional view of a thin-film EL device as the second embodiment, 21 is a glass substrate, 22 is a transparent electrode, a plurality of transparent electrodes 22 in stripes being formed on the glass substrate 21, 23 is a $SiO_2$ film, 24 is a $Si_3N_4$ film. The $SiO_2$ film 23 and the $Si_3N_4$ film 24 constitutes a lower dielectric layer. 25 is a ZnS:Mn film as luminescent layer formed on the lower dielectric layer. An upper dielectric layer consisting of a $Si_3N_4$ film 26, an a-Si film 27 and a SiON film 29 is formed on the luminescent layer 25. Back electrodes 28 in stripes are formed of Al on the upper dielectric layer in such a manner that the back electrodes 28 perpendicularly intersect the transparent electrodes 22.

The upper dielectric layer, a characteristic portion of the thin-film EL device of the embodiment, will be described in detail hereinbelow.

The upper dielectric layer is formed by forming the $Si_3N_4$ film 26, the a-Si film 27 and the SiON film 29 in this order by a plasma CVD method under the following condition.

First, the $Si_3N_4$ film 26 is formed by using $SiH_4$ and $N_2$ as reaction gas at a concentration of 2% of $SiH_4$. The a-Si film 27 is formed by using only $SiH_4$ as reaction gas. The SiON film 29 is formed by using $SiH_4$, $N_2$ and $N_2O$ as reaction gas at a concentration of 2% of $SiH_4$ as well as 2% of $N_2O$. In this way, the three films are formed continuously by a simple method. In both cases of the $Si_3N_4$ film 26 and the SiON film 29 formed in such a way, conductivity in the range of $10^{-13}$–$10^{-15}$ $ohm^{-1} \cdot cm^{-1}$ has been obtained. In the case of the a-Si film 27, when there is no light emission, namely in the darkness, conductivity $\sigma d$ in the range of $10^{-9}$–$10^{-10}$ $ohm^{-1} \cdot cm^{-1}$ has been obtained, and when there is light emission, conductivity $\sigma ph$ of around $10^{-5}$ $ohm^{-1} \cdot cm^{-1}$ has been obtained. As shown in FIG. 8, the conductivities $\sigma d$ and $\sigma ph$ of the a-Si film, when formed by mixing $N_2$ into $SiH_4$ in a $N_2/SiH_4$ ratio of $0$–$10^{-2}$, assume similar values.

A plurality of thin-film EL devices having the above construction wherein a thickness of the $Si_3N_4$ film 26 is fixed to 300–400Å and the a-Si film 27 and the SiON film 29 are different from each other have been examined in respect with contrast, luminance-voltage characteristics and dielectric breakdown characteristics. As a result, the optimal thicknesses for the a-Si film 26 and SiON film 29 prove to be 1000Å and 1500-1600Å, respectively.

The thin-film EL device has the following performance.

The a-Si film 27 has an energy gap of about 1.7-2.0 eV and the color of the film 27 is dark brown or light brown. For this reason, light emitted from the luminescent layer 25 toward the back electrodes 28 can be absorbed in the a-Si film 27. As a result, light emitted from the luminescent layer 25 is prevented from being reflected by the back electrodes 28 onto the glass substrate 21. Thus, contrast of images or the like displayed by this device is improved.

Of all light components of light which the luminescent layer 25 formed of ZnS:Mn emits, a light component belonging to a wavelength corresponding to an energy gap of 2.1 eV has the largest intensity. Therefore, once the luminescent layer 25 emits light, no matter how weak the light is, the a-Si film 27 can absorb the light. As a result, the a-Si film increases in conductivity and therefore in effective field intensity to the luminescent layer 25. Accordingly, as shown in FIG. 9, a luminance-voltage characteristics curve B according to the present invention has an abrupt rising, as compared with a curve A of a conventional thin-film EL device. This indicates that EL characteristics are improved.

Dielectric breakdown characteristics of the device depend on a thickness of the SiON film, an oxygen content in the SiON film, and a thickness of the a-Si film. When the a-Si film was 1000Å thick and the SiON film was 1500-1600Å thick, good dielectric breakdown characteristics were obtained.

Luminance characteristics and emission-start voltage characteristics greatly depend on a fabrication condition under which the $Si_3N_4$ film 26 to be overlaid on the luminescent layer 25 is fabricated. In this embodiment, the fabrication condition was that a gas concentration of $SiH_4$ was 2% and that a thickness of the $Si_3N_4$ film was 300-400Å, as described above. Under this condition, a good result was obtained.

In this embodiment, composition of each film constituting the upper dielectric layer was constant. However, a mixture ratio of reaction gases of $SiH_4$, $N_2$ and $N_2O$ can be gradually changed when forming the $Si_3N_4$ film 26, the a-Si film 27 and the SiON film 29 on the luminescent layer 25 so that the composition of the $Si_3N_4$ film 26, the a-Si film 27 and the SiON film 29 is continuously changed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin-film electroluminescence device having transparent electrodes formed on a transparent substrate, a lower dielectric layer formed on the substrate having the transparent electrodes, a luminescent layer formed on the lower dielectric layer, an upper dielectric layer formed on the luminescent layer, and back electrodes formed on the upper dielectric layer, wherein the upper dielectric layer includes an amorphous non-transparent silicon film and first and second dielectric films sandwiching the amorphous non-transparent silicon therebetween, the first dielectric film being formed in contact with the luminescent layer.

2. The device as claimed in claim 1, wherein the first dielectric film is a silicon nitride film and the second dielectric film is a silicon oxynitride film, and the first and second films and the non-transparent amorphous silicon film are formed by a plasma chemical vapor deposition method.

3. The device as claimed in claim 1, wherein the luminescent layer is made of ZnS:Mn.

4. The device as claimed in claim 2, wherein the luminescent layer is made of ZnS:Mn.

5. A thin-film electroluminescence device comprising:
   transparent electrodes formed on a transparent substrate;
   a lower dielectric layer formed on the transparent substrate
   a luminescent layer of ZnS:Mn formed on the lower dielectric layer;
   an upper dielectric layer formed on the luminescent layer, and back electrodes formed on the upper dielectric layer, wherein the upper dielectric layer includes a non-transparent amorphous silicon film disposed between a first dielectric film of silicon nitride and a second dielectric film of silicon oxynitride, the first dielectric film being formed in contact with the luminescent layer.

6. The device as claimed in claim 1, wherein the lower dielectric layer comprises a first silicon nitride film formed so as to be in contact with the luminescent layer and a second film of $SiO_2$ disposed in contact with said first silicon nitride film.

7. The device as claimed in claim 5, wherein the lower dielectric layer comprises a first silicon nitride film formed so as to be in contact with the luminescent layer and a second film of $SiO_2$ in contact with said first silicon nitride film.

8. The device as claimed in claim 1, wherein the non-transparent amorphous silicon film is brown.

9. The device as claimed in claim 5, wherein the non-transparent amorphous silicon film is brown.

* * * * *